United States Patent
Chun

(10) Patent No.: US 8,299,478 B2
(45) Date of Patent: Oct. 30, 2012

(54) ORGANIC LIGHT EMITTING DIODE DISPLAY DEVICE HAVING A PIXEL DEFINING LAYER AND METHOD OF FABRICATING THE SAME

(75) Inventor: Byung-Hoon Chun, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 182 days.

(21) Appl. No.: 12/656,592

(22) Filed: Feb. 4, 2010

(65) Prior Publication Data
US 2010/0193791 A1 Aug. 5, 2010

(30) Foreign Application Priority Data

Feb. 5, 2009 (KR) .................. 10-2009-0009341

(51) Int. Cl.
H01L 51/52 (2006.01)
(52) U.S. Cl. .............. 257/91; 257/E51.022; 257/40; 257/81; 257/98
(58) Field of Classification Search ............ 257/81, 257/91, 98, 40, E51.022; 313/504
See application file for complete search history.

(56) References Cited

U.S. PATENT DOCUMENTS

| | | | | |
|---|---|---|---|---|
| 6,407,408 | B1* | 6/2002 | Zhou et al. .............. | 257/40 |
| 2004/0119084 | A1* | 6/2004 | Hsieh et al. ............ | 257/98 |
| 2006/0001033 | A1* | 1/2006 | Tsujimura et al. ....... | 257/88 |
| 2007/0178224 | A1* | 8/2007 | Fujii et al. ............ | 427/66 |
| 2007/0228937 | A1 | 10/2007 | Akiyoshi | |
| 2007/0241671 | A1* | 10/2007 | Kai et al. ............. | 313/504 |
| 2007/0290604 | A1* | 12/2007 | Sakanoue et al. ....... | 313/503 |
| 2008/0174238 | A1* | 7/2008 | Jeong et al. ........... | 313/504 |
| 2008/0218061 | A1* | 9/2008 | Chao et al. ............ | 313/504 |
| 2009/0146557 | A1* | 6/2009 | Shinto et al. .......... | 313/504 |
| 2009/0302746 | A1* | 12/2009 | Lim et al. ............. | 313/504 |
| 2010/0001633 | A1* | 1/2010 | Lee et al. ............. | 313/504 |
| 2010/0032678 | A1* | 2/2010 | Kim et al. ............. | 257/72 |
| 2010/0096655 | A1* | 4/2010 | Lee et al. ............. | 257/98 |

FOREIGN PATENT DOCUMENTS

| | | |
|---|---|---|
| JP | 2003-045669 A | 2/2003 |
| JP | 2007-286111 A | 11/2007 |
| JP | 2007-287346 A | 11/2007 |
| JP | 2008-078038 A | 4/2008 |
| KR | 10-2003-0086821 A | 11/2003 |
| KR | 10 2004-0059492 A | 7/2004 |
| KR | 10-2007-0086154 A | 8/2007 |

OTHER PUBLICATIONS

Persans et al., dielectric materials in optical waveguide applications, chapter 11 in Interlayer Dielectrics, Murarka et al, editors, Elsevier, 2003. (See attached excerpts.).*

* cited by examiner

Primary Examiner — Fernando L Toledo
Assistant Examiner — Peter Bradford
(74) Attorney, Agent, or Firm — Lee & Morse, P.C.

(57) ABSTRACT

An OLED display device includes a substrate, a TFT on the substrate, the TFT including a semiconductor layer, a gate electrode, and source and drain electrodes, a first electrode electrically connected to one of the source and drain electrodes, a pixel defining layer on the substrate, the pixel defining layer exposing the first electrode and having a reversed trapezoidal shape, an emitting layer on the exposed first electrode, and a second electrode on the emitting layer.

20 Claims, 4 Drawing Sheets

ORGANIC LIGHT EMITTING DIODE DISPLAY DEVICE HAVING A PIXEL DEFINING LAYER AND METHOD OF FABRICATING THE SAME

BACKGROUND

1. Field

Example embodiments relate to an organic light emitting diode (OLED) display device having a reversed trapezoidal pixel defining layer to separate organic functional layers of adjacent pixels, thereby exhibiting excellent gradation characteristics and color purity, and to a method of fabricating the same.

2. Description of the Related Art

Generally, an OLED display device may emit light when electrons and holes injected into an emitting layer thereof through an electron injection electrode (cathode) and a hole injection electrode (anode), respectively, are combined. In particular, the holes and electrons may be combined in the emitting layer into excitons having an excited energy state, so when an energy level of the excitons is reduced to a ground state from the excited state, the OLED display device may emit light.

Accordingly, compared, e.g., to a conventional liquid crystal thin film display device, the OLED display device may not require a separate light source. Therefore, the OLED display device may have reduced volume and weight.

The OLED display devices may be classified into passive matrix types and active matrix types according to the driving method.

The passive-matrix OLED display device may have a simple configuration and, thus, may be fabricated in a simple process. The passive-matrix OLED display device, however, may have high consumption power, difficulty in fabricating a large-sized device, and a decreased aperture ratio as a number of interconnections therein increases. For example, while the passive-matrix OLED display device may be used for small display devices, the active-matrix OLED display device may be used for large display devices.

A conventional OLED display device may have an organic layer including an emitting layer between first and second electrodes. The organic layer may include an emitting layer and functional layers, e.g., a hole injection layer, a hole transport layer, an electron transport layer, and an electron injection layer, to achieve an OLED display device having low resistance and high efficiency. However, the conventional functional layers of the organic layer, i.e., the hole injection layer, the hole transport layer, the electron transport layer and the electron injection layer, may be commonly formed on a conductive layer over all pixel regions in the OLED display device. Thus, charges may be laterally migrated, resulting in emitting light from undesired pixels and decreasing gradation characteristics and color purity of emitted red, green and blue lights, as well as white light created by mixing the red, green and blue lights.

SUMMARY

Embodiments are therefore directed to an OLED display device and a method of fabricating the same, which substantially overcome one or more of the problems due to the limitations and disadvantages of the related art.

It is therefore a feature of an embodiment to provide an OLED display device having excellent gradation characteristics and high color purity.

It is therefore another feature of an embodiment to provide a method of fabricating an OLED display device exhibiting excellent gradation characteristics and high color purity.

At least one of the above and other features and advantages may be realized by providing an OLED display device, including a substrate, a TFT including a semiconductor layer, a gate electrode, and source and drain electrodes, which are formed on the substrate, a first electrode electrically connected to one of the source and drain electrodes, a pixel defining layer exposing the first electrode and having a reversed trapezoidal shape, an emitting layer disposed on the first electrode, and a second electrode disposed on the emitting layer. The OLED display device may further include at least one functional layer between the first and second electrodes, the functional layer being at least one of a hole injection layer, a hole transport layer, an electron blocking layer, a hole blocking layer, an electron transport layer, and an electron injection layer.

The at least one functional layer may be on the first electrode, the at least one functional layer being separated from a corresponding functional layer on an adjacent first electrode. The OLED display device may include a plurality of functional layers on the first electrode, the plurality of functional layers being separated from corresponding functional layers on an adjacent first electrode. The at least one functional layer may include a first portion on the exposed first electrode and a second portion on the pixel defining layer, the first and second portions of the at least one functional layer being separated from each other. The first and second portions of the at least one functional layer may be at different heights with respect to the substrate. The pixel defining layer may include an opening therethrough to expose the first electrode, at least one surface of the pixel defining layer facing the opening being inclined with respect to the substrate to define the reversed trapezoidal shape of the pixel defining layer. A surface of the pixel defining layer facing the substrate may be shorter than a surface of the pixel defining layer facing away from the substrate. The pixel defining layer may include one or more of an acryl series resin, benzocyclobutene (BCB), and polyimide (PI).

At least one of the above and other features and advantages may also be realized by providing a method of fabricating an OLED display device, including forming a TFT including a semiconductor layer, a gate electrode and source and drain electrodes on a substrate, forming a first electrode electrically connected to one of the source and drain electrodes, forming a pixel defining layer exposing the first electrode and having a reversed trapezoidal shape, forming an emitting layer on the first electrode; and forming a second electrode on the emitting layer. The method may further include forming at least one functional layer between the first and second electrodes, the functional layer being at least one of a hole injection layer, a hole transport layer, an electron blocking layer, a hole blocking layer, an electron transport layer, and an electron injection layer.

The at least one functional layer may be formed on the first electrode, such that the at least one functional is separated from a corresponding functional layer on an adjacent first electrode. Forming the at least one functional layer may include forming a first portion on the exposed first electrode and a second portion on the pixel defining layer, the first and second portions of the at least one functional layer being at different heights with respect to the substrate. The pixel defining layer may be formed of one or more of an acryl series resin, BCB, and PI. Forming the pixel defining layer may include applying a first material to form a pixel defining material layer, the first material including one or more of an acryl series resin, BCB, and P, applying a negative photoresist material to the pixel defining material layer to form a negative photoresist layer, and performing light irradiation, development, and etching processes to a predetermined part of the negative photoresist layer. The etching process may be a wet etching process, and the negative photoresist layer and the pixel defining material layer are over-etched. The method may further include, after the etching process, removing the negative photoresist layer. Forming the pixel defining layer may include applying a first material to form a pixel defining material layer, providing an etch mask adjacent to the pixel defining material layer, and anisotropically wet etching the pixel defining material layer through the etch mask.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
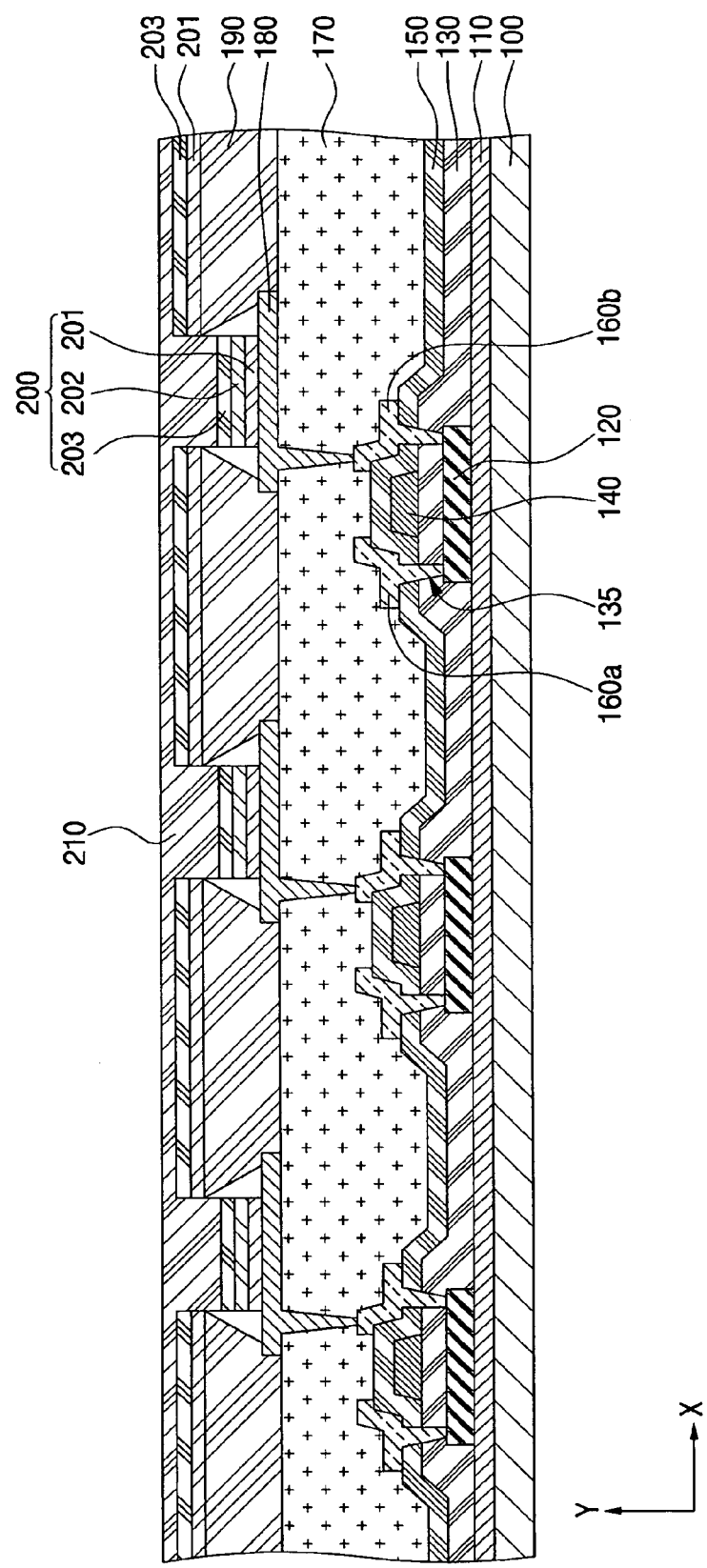
FIG. 1 illustrates a cross-sectional view of an OLED display device according to an example embodiment.

Korean Patent Application No. 10-2009-0009341, filed on Feb. 5, 2009, in the Korean Intellectual Property Office, and entitled: "Organic Light Emitting Diode Display Device and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an OLED display device according to an example of the present invention. It is noted that FIG. 1 illustrates a cross-sectional view of an active-matrix OLED display device including a plurality of pixel regions. In the pixel regions, like numerals denote like positions thereof.

Referring to FIG. 1, a buffer layer 110 may be formed on a substrate 100.

The substrate 100 may be formed, e.g., of one or more of glass, stainless steel, and plastic. The buffer layer 110 may be formed, e.g., of one or more of a silicon nitride layer and a silicon oxide layer.

Here, the buffer layer 110 may prevent or substantially minimize diffusion of moisture or impurities generated from the underlying substrate 100, or may facilitate crystallization of a semiconductor layer 120 formed in a subsequent process by controlling a heat transfer rate during the crystallization.

For example, the semiconductor layer 120 may be formed as follows. An amorphous silicon layer may be formed on the buffer layer 110, and may be crystallized into a polycrystalline or single crystal silicon layer. Next, the crystallized silicon layer may be patterned to form the semiconductor layer 120 on the buffer layer 110. The amorphous silicon layer may be formed, e.g., by chemical vapor deposition or physical vapor deposition. During or after the formation of the amorphous silicon layer, dehydration may be performed to reduce a concentration of hydrogen. In addition, the amorphous silicon layer may be crystallized, e.g., by one of rapid thermal annealing (RTA), solid phase crystallization (SPC), metal induced crystallization (MIC), metal induced lateral crystallization (MILC), super grain silicon (SGS), excimer laser annealing (ELA) and sequential lateral solidification (SLS).

A gate insulating layer 130, e.g., formed of silicon oxide, silicon nitride or a combination thereof, may be formed on the entire substrate 100 having the semiconductor layer 120. Next, a gate electrode material including, e.g., one or more of aluminum (Al), an Al alloy, molybdenum (Mo) and a Mo alloy, may be formed on the gate insulating layer 130. For example, the gate electrode material may be a molybdenum-tungsten (MoW) alloy.

The gate electrode material may be patterned to form a gate electrode 140.

The source and drain regions of the semiconductor layer 120 may be formed by ion doping using the gate electrode 140 as a mask.

Subsequently, an interlayer insulating layer 150 may be formed on the entire surface of the substrate 100 having the gate electrode 140. Here, the interlayer insulating layer 150 may be formed, e.g., of silicon nitride, silicon oxide or a combination thereof.

The gate insulating layer 130 and the interlayer insulating layer 150 may be etched to form contact holes 135 therethrough. The contact holes 135 may expose the source and drain regions of the semiconductor layer 120.

Source and drain electrodes 160a and 160b may be formed on the interlayer insulating layer 150. The source and drain electrodes 160a and 160b may be connected to the source and drain regions of the semiconductor layer 120 through the contact holes 135. Here, the source and drain electrodes 160a and 160b may be formed of, e.g., one or more of Mo, W, MoW, tungsten silicide ($WSi_2$), molybdenum silicide ($MoSi_2$) and Al. Thus, a thin film transistor (TFT) including the semiconductor layer 120, the gate electrode 140, and the source and drain electrodes 160a and 160b may be completed.

An insulating layer 170 may be formed on the entire surface of the substrate 100 having the TFT. The insulating layer 170 may be formed of an inorganic material, e.g., one or more of silicon oxide, silicon nitride and silicate on glass, an organic material, e.g., one or more of polyimide, benzocyclobutene series resin and acrylate, or a combination of the inorganic material and the organic material.

The insulating layer 170 may be etched to form a via hole therethrough exposing the source or drain electrode 160a or 160b. A first electrode 180 may be formed on the insulating layer 170, and may be connected to one of the source and drain electrodes 160a and 160b through the via hole. The first electrode 180 may be an anode or a cathode. For example, when the first electrode 180 is an anode, the anode may be formed of a transparent conductive layer formed, e.g., of one or more of ITO, IZO and ITZO. In another example, when the first electrode 180 is a cathode, the cathode may be formed of, e.g., one or more of Mg, Ca, Al, Ag, Ba or an alloy thereof.

A pixel defining layer 190 exposing the first electrode 180 and having a reversed trapezoidal shape may be formed on the insulating layer 170, as illustrated in FIG. 1. A structure of the pixel defining layer 190 and a method of its fabrication will be described in more detail below.

Figure 2A:
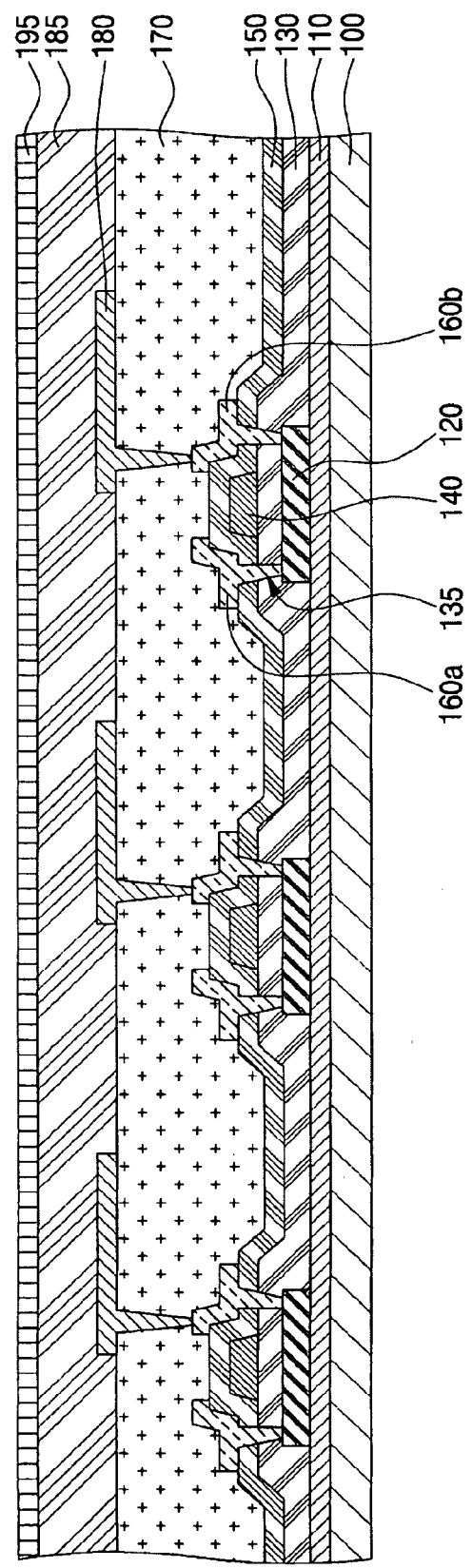
FIGS. 2A to 2C illustrate views of sequential stages in a process of fabricating a pixel defining layer according to an example embodiment.
Figure 2B:
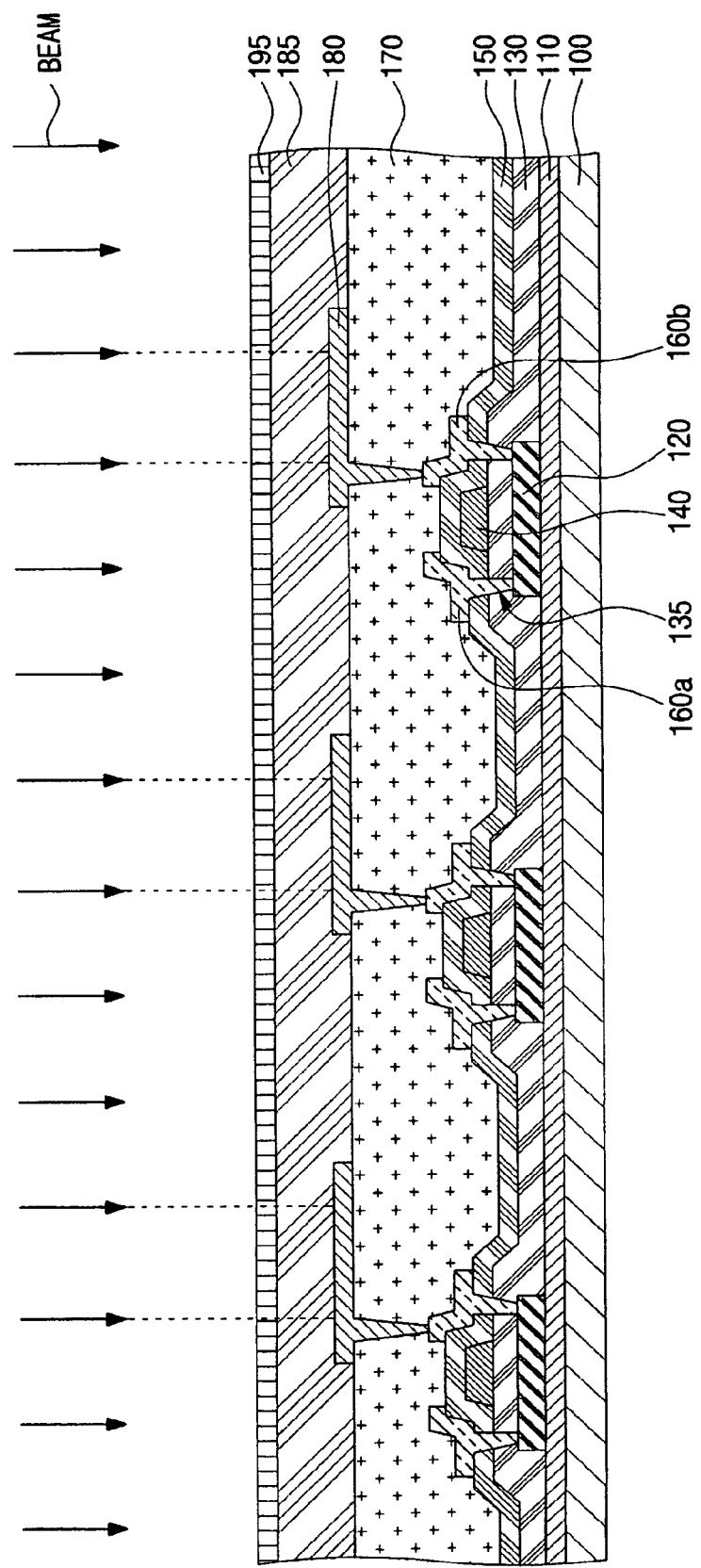
Figure 2C:
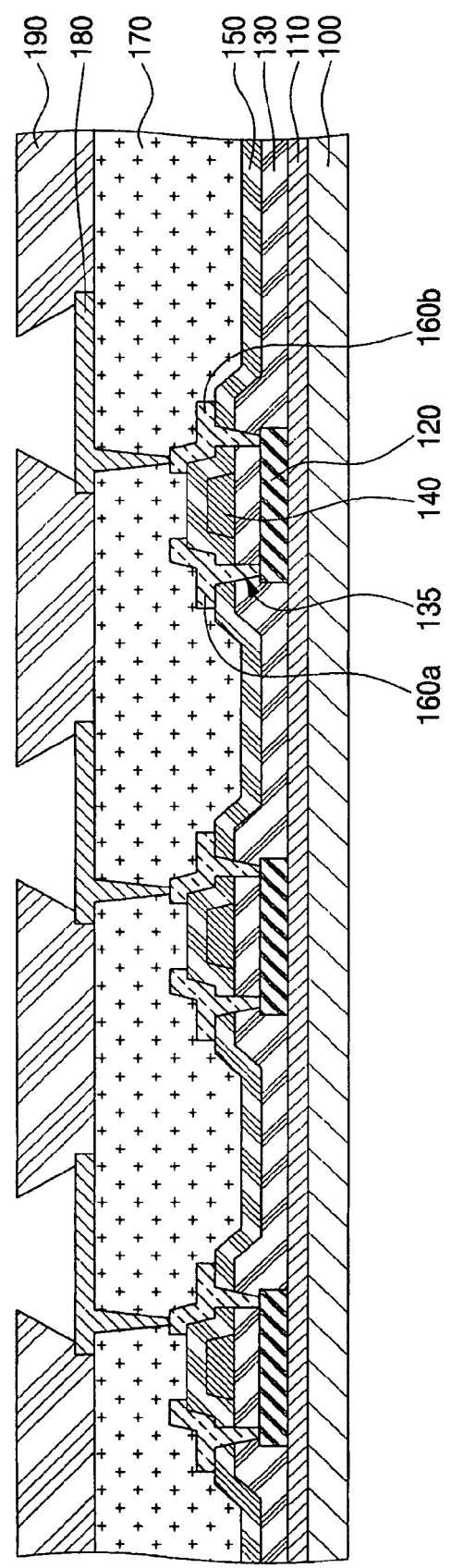

FIGS. 2A to 2C illustrate sequential steps in a process of forming a pixel defining layer according to an example embodiment of the present invention.

Referring to FIG. 2A, a pixel defining material layer 185 may be formed by applying a material for a pixel defining layer on the substrate 100 having the TFT, i.e., including the semiconductor layer 120, gate electrode 140 and source and drain electrodes 160a and 160b, and the first electrode 180 electrically connected to the TFT via the source and drain electrodes 160a and 160b. The pixel defining material layer 185 may include, e.g., one or more of an acryl series resin, benzocyclobutene (BCB), and polyimide (PI).

A negative photoresist layer 195 may be formed on the pixel defining layer material layer 185. The negative photoresist layer 195 may be formed of a negative photoresist material applied to the pixel defining layer material layer 185. It is noted that even though the negative photoresist layer 195 is used to describe formation of the pixel defining layer 190, other types of photoresists, e.g., a positive photoresist, may be used.

Referring to FIG. 2B, light may be selectively applied to the negative photoresist layer 195 through a mask (not shown). Accordingly, the light may be selectively applied to regions of the negative photoresist layer 195 that correspond to portions of the pixel defining layer 190 to be formed subsequently. Then, regions of the negative photoresist layer 195 not exposed to the light may be developed, so portions of the negative photoresist layer 195 overlapping the first electrodes 180, e.g., portions between the dashed lines in FIG. 2C overlapping the first electrodes 180, may be dissolved, as will be discussed in more detail below with reference to FIG. 2C.

Referring to FIG. 2C, the developed negative photoresist layer 195 and pixel defining material layer 185 may be wet etched, e.g., anisotropically wet etched. For example, a part of the negative photoresist layer 195 to which light is not applied may be dissolved by the wet etching. The pixel defining material layer 185 disposed below the dissolved part of the negative photoresist layer 195 may be over-etched during the wet etching, so that an opening may be formed through the pixel defining material layer 185 to form the pixel defining layer 190. The pixel defining layer 190 may have a reversed trapezoidal shape. After the negative photoresist layer 195 is removed, the reversed trapezoidal pixel defining layer 190 may be completed.

For example, when the pixel defining material layer 185 is over-etched, at least one side surface of the pixel defining layer 190, i.e., a surface facing the opening in the pixel defining layer 190, may be inclined at a non-right angle with respect to the insulating layer 170. In other words, the pixel defining layer 190 may have a reversed trapezoidal cross-section in the xy-plane, as illustrated in FIG. 1. In the reversed trapezoidal pixel defining layer 190 a lower surface, i.e., a surface of the pixel defining layer 190 facing the insulating layer 170, may be shorter than an upper surface, i.e., a surface of the pixel defining layer 190 opposite the lower surface and facing away from the insulating layer 170. It is noted that lengths of the lower and upper surfaces of the pixel defining layer 190 are determined along a horizontal direction, i.e., along the x-axis, and the side surfaces of the pixel defining layer 190 extend between the lower and upper surfaces.

Referring again to FIG. 1, the pixel defining layer 190 may be formed in a reversed trapezoidal shape, and may define a pixel region. For example, as illustrated in FIG. 1, a first electrode 180 in each pixel region may be between two reverse trapezoidal shaped portions of the pixel defining layer 190. A hole transport layer 201 may be deposited on the first electrode 180 exposed by an opening of the pixel defining layer 190, i.e., between reverse trapezoidal shaped portions of the pixel defining layer 190. Next, as illustrated in FIG. 1, an emitting layer 202 may be formed on the hole transport layer 201. For example, a hole injection layer (not illustrated) may be formed between the first electrode 180 and the hole transport layer 201, and an electron blocking layer (not illustrated) may be formed between the emitting layer 202 and the hole transport layer 201. The hole injection layer and the electron blocking layer may be formed, e.g., by deposition. Since the pixel defining layer 190 is formed in a reversed trapezoidal shape, a functional layer in each pixel, e.g., the hole injection layer, the hole transport layer 201, and the electron blocking layer, may be deposited separately in each pixel region.

For example, as illustrated in FIG. 1, the functional layers, i.e., the hole injection layer, the hole transport layer 201, and the electron blocking layer, on each first electrode 180 of a pixel region may be separated, e.g., completely separated via the pixel defining layer 190, from corresponding functional layers on a first electrode 180 of an adjacent pixel region. For example, a functional layer may include a first portion on the exposed first electrode 180 and a second portion on the pixel defining layer 190, so that the first portion may be parallel to and separated from the second portion. In other words, when a functional layer is deposited, each first portion of a functional layer may be non-continuous with a second portion of the functional layer, e.g., the first and second portions of the functional layer may be at different heights with respect to the insulating layer 170, because of the reverse trapezoidal shape of the pixel defining layer 190. For example, as further illustrated in FIG. 1, the functional layers, i.e., the hole injection layer, the hole transport layer 201, and the electron blocking layer, may be spaced apart from the pixel defining layer 190.

Thus, as the functional layers including the hole injection layer, the hole transport layer 201, and the electron blocking layer are separately formed in each pixel region, the gradation characteristics of red, green and blue lights, as well as white light created by mixing the red, green and blue lights, in the respective pixel regions may be improved. Further, a decrease in efficiency due to transfer of a current to another pixel region may be prevented or substantially minimized as compared to a conventional structure, i.e., a structure where at least one functional layer is commonly and continuously formed in a plurality of adjacent pixel regions. Further, color purity of an OLED display device according to an example embodiment may be improved.

After the hole injection layer, the hole transport layer 201, and the electron blocking layer are separately formed in each pixel region, the emitting layer 202 may be formed on the hole transport layer 201, e.g., on the electron blocking layer. The emitting layer 202 may emit one of red, green and blue lights in each pixel region. The emitting layer 202 may be formed, e.g., by patterning.

An electron transport layer 203 may be formed on the emitting layer 202 by, e.g., deposition. The electron transport layer 203 may be separately formed in each pixel region due to the reversed trapezoidal pixel defining layer, as discussed previously with reference to the hole transport layer 201. For example, an electron injection layer (not illustrated) may be formed between the electron transport layer 203 and a second electrode 210 to be formed later, and a hole blocking layer (not illustrated) may be formed between the emitting layer 202 and the electron transport layer 203. It is noted that the functional layers described previously may also refer to the electron injection layer, the electron transport layer 203, and the hole blocking layer. It is further noted that organic layers 200 may include the emitting layer 202 and the functional layers, i.e., one or more of the hole injection layer, the hole transport layer 201, the electron blocking layer, the electron injection layer, the electron transport layer 203, and the hole blocking layer. The hole blocking layer, the electron transport layer 203, and the electron injection layer may also be separately formed in each pixel region due to the reversed trapezoidal pixel defining layer 190, and, e.g., may be spaced apart from side surfaces of the reversed trapezoidal pixel defining layer 190.

Accordingly, due to the hole blocking layer, electron transport layer 203, and electron injection layer, which may be separately formed, the pixel region may have improved gradation characteristics of red, green and blue lights, as well as white light created by mixing the red, green and blue lights. Further, a decrease in efficiency due to transfer of a current to another pixel region may be prevented or substantially minimized, as compared to the conventional structure. Further, color purity of the OLED display device according to example embodiments may be improved.

The second electrode 210 may be formed on the entire surface of the substrate 100 having the first electrodes 181, e.g., on the electron injection layer. Thus, the OLED display device according to the example of the present invention may be completed. The second electrode 210 may be a common electrode formed on all the pixel regions. For example, as illustrated in FIG. 1, the second electrode 210 may include a linear portion on the reversed trapezoidal pixel defining layer 190, and may include a protruding portion extending into the opening of the reversed trapezoidal pixel defining layer 190, e.g., a distance between an uppermost surface of the organic layers 200 and the insulating layer 170 may be shorter than a distance between the upper surface of the pixel defining layer 190 and the insulating layer 170.

In example embodiments, a top-gate TFT is described. It is noted, however, that other types of TFTs, e.g., a bottom-gate TFT having a gate electrode formed below a semiconductor layer, are included within the scope of the present invention.

According to example embodiments of the present invention, as a pixel defining layer is formed in a reversed trapezoidal shape, organic functional layers may be easily separated, so that each organic functional layer in a pixel region may be separated from organic functional layers in adjacent pixel areas. Thus, an OLED display device according to example embodiments may exhibit excellent gradation characteristics and color purity.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display device, comprising:
    a substrate;
    a thin film transistor (TFT) on the substrate, the TFT including a semiconductor layer, a gate electrode, and source and drain electrodes;
    a first electrode electrically connected to one of the source and drain electrodes;
    a pixel defining layer on the substrate, the pixel defining layer exposing the first electrode and having a reversed trapezoidal shape, such that the pixel defining layer has a lower surface facing the substrate, and an upper surface facing away from the substrate and projecting past the lower surface to form an overhang;
    an emitting layer on the exposed first electrode; and
    a second electrode on the emitting layer, the second electrode including a first portion that overlaps the upper surface of pixel defining layer, and a second portion that projects past the overhang of the pixel defining layer, wherein the first portion and the second portion are continuous.

2. The OLED display device as claimed in claim 1, further comprising at least one functional layer between the first and second electrodes, the functional layer being at least one of a hole injection layer, a hole transport layer, an electron blocking layer, a hole blocking layer, an electron transport layer, and an electron injection layer.

3. The OLED display device as claimed in claim 2, wherein the at least one functional layer is on the first electrode, the at least one functional layer being separated from a corresponding functional layer on an adjacent first electrode.

4. The OLED display device as claimed in claim 2, wherein the OLED display device includes a plurality of functional layers on the first electrode, the plurality of functional layers being separated from corresponding functional layers on an adjacent first electrode.

5. The OLED display device as claimed in claim 2, wherein the at least one functional layer includes a first portion on the exposed first electrode and a second portion on the pixel defining layer, the first and second portions of the at least one functional layer being separated from each other.

6. The OLED display device as claimed in claim 5, wherein the first and second portions of the at least one functional layer are at different heights with respect to the substrate.

7. The OLED display device as claimed in claim 1, wherein the pixel defining layer includes an opening therethrough to expose the first electrode, at least one surface of the pixel defining layer facing the opening being inclined with respect to the substrate to define the reversed trapezoidal shape of the pixel defining layer.

8. The OLED display device as claimed in claim 1, wherein a surface of the pixel defining layer facing the substrate is shorter than a surface of the pixel defining layer facing away from the substrate.

9. The OLED display device as claimed in claim 1, wherein the pixel defining layer includes one or more of an acryl series resin, benzocyclobutene (BCB), and polyimide (PI).

10. A method of fabricating an organic light emitting diode (OLED) display device, comprising:
    forming a thin film transistor (TFT) on a substrate, the TFT including a semiconductor layer, a gate electrode, and source and drain electrodes;
    forming a first electrode electrically connected to one of the source and drain electrodes;
    forming a pixel defining layer on the substrate, the pixel defining layer exposing the first electrode and having a reversed trapezoidal shape, such that the pixel defining layer has a lower surface facing the substrate, and an upper surface facing away from the substrate and projecting past the lower surface to form an overhang;
    forming an emitting layer on the exposed first electrode; and forming a second electrode on the emitting layer, the second electrode including a first portion that overlaps the upper surface of pixel defining layer, and a second portion that projects past the overhang of the pixel defining layer, wherein the first portion and the second portion are continuous.

11. The method as claimed in claim 10, further comprising forming at least one functional layer between the first and second electrodes, the functional layer being at least one of a hole injection layer, a hole transport layer, an electron blocking layer, a hole blocking layer, an electron transport layer, and an electron injection layer.

12. The method as claimed in claim 11, wherein the at least one functional layer is formed on the first electrode, such that the at least one functional is separated from a corresponding functional layer on an adjacent first electrode.

13. The method as claimed in claim 11, wherein forming the at least one functional layer includes forming a first portion on the exposed first electrode and a second portion on the pixel defining layer, the first and second portions of the at least one functional layer being formed at different heights with respect to the substrate.

14. The method as claimed in claim 10, wherein the pixel defining layer is formed of one or more of an acryl series resin, BCB, and PI.

15. The method as claimed in claim 10, wherein forming the pixel defining layer includes:
applying a first material to form a pixel defining material layer, the first material including one or more of an acryl series resin, BCB, and PI;
applying a negative photoresist material to the pixel defining material layer to form a negative photoresist layer; and
performing light irradiation, development, and etching processes to a predetermined part of the negative photoresist layer.

16. The method as claimed in claim 15, wherein the etching process is a wet etching process, and the negative photoresist layer and the pixel defining material layer are over-etched.

17. The method as claimed in claim 15, further comprising, after the etching process, removing the negative photoresist layer.

18. The method as claimed in claim 10, wherein forming the pixel defining layer includes:
applying a first material to form a pixel defining material layer;
providing an etch mask adjacent to the pixel defining material layer; and
anisotropically wet etching the pixel defining material layer through the etch mask.

19. The OLED display device as claimed in claim 1, wherein the second portion of the second electrode includes a portion that extends below the upper surface of the pixel defining layer.

20. The method as claimed in claim 10, wherein the second portion of the second electrode includes a portion that extends below the upper surface of the pixel defining layer.

* * * * *